United States Patent [19]
Yoshimura

[11] Patent Number: 5,900,787
[45] Date of Patent: May 4, 1999

[54] DUAL-MODE, CRYSTAL RESONATOR/ EXTERNAL CLOCK, OSCILLATOR CIRCUIT

[75] Inventor: Katsutoshi Yoshimura, Tokyo, Japan

[73] Assignee: Oki Electric Industry Co., Ltd., Tokyo, Japan

[21] Appl. No.: 08/917,348

[22] Filed: Aug. 26, 1997

[30] Foreign Application Priority Data

Oct. 28, 1996 [JP] Japan ................................ 8-284950

[51] Int. Cl.⁶ .................. H03B 5/06; H03B 5/36
[52] U.S. Cl. ............ 331/116 FE; 331/59; 331/74; 331/108 C; 331/108 A; 331/158; 331/185; 331/173
[58] Field of Search ............................ 331/49, 59, 74, 331/109, 116 R, 116 FE, 117 R, 117 FE, 108 C, 108 D, 108 A, 158, 173, 175, 182, 185, DIG. 3

[56] References Cited

U.S. PATENT DOCUMENTS 5,025,230  6/1991  Kondo et al. .................. 331/116 FE
5,416,445  5/1995  Narahara ................................ 331/49
5,453,719  9/1995  Narahara ................................ 331/49
5,532,652  7/1996  Koyama et al. .................. 331/116 FE

FOREIGN PATENT DOCUMENTS 0 398 331 A2  11/1990  European Pat. Off. .
0 642 222 A2   3/1995  European Pat. Off. .
0 657 994 A1   6/1995  European Pat. Off. .
0 658 974 A1   6/1995  European Pat. Off. .

*Primary Examiner*—David Mis
*Attorney, Agent, or Firm*—Jones & Volentine, L.L.P.

[57] ABSTRACT

An oscillator circuit, having an inverter with input and output terminals interconnected through a feedback resistance, operates in two modes. In a first mode, the input and output terminals are coupled to an external crystal resonator. In a second mode, an external clock signal is supplied to the input terminal. In the second mode, the input terminal is disconnected from the output terminal, and in addition, the output-drive capacity of the inverter is reduced, or the output terminal of the inverter is held at a fixed potential.

8 Claims, 2 Drawing Sheets

5,900,787

DUAL-MODE, CRYSTAL RESONATOR/ EXTERNAL CLOCK, OSCILLATOR CIRCUIT

BACKGROUND OF THE INVENTION

The present invention relates to an oscillator suitable for use in an integrated circuit such as a microcontroller.

Microcontrollers, also referred to as microcontroller units (MCUs) or single-chip microcomputers, use an on-chip oscillator circuit to generate an internal clock signal. The oscillator circuit conventionally comprises an inverter, the input and output terminals of which are coupled together through a feedback resistor, causing the inverter to oscillate between the high and low output states. The input and output terminals are also coupled to external leads of the microcontroller package.

In a first mode of operation, these external leads are coupled to an external crystal resonator, which determines the oscillation frequency of the inverter. In a second mode of operation, an external clock signal is supplied to the external lead coupled to the input terminal of the inverter, and the inverter oscillates at the frequency of the external clock signal. The other external lead may be left open, or a complementary external clock signal created by an external inverter may be supplied to this external lead.

To drive the external crystal employed in the first mode, the oscillator's inverter requires a high output-drive capacity, but this capability has unwanted consequences when the second mode is employed. If the external lead coupled to the output terminal of the inverter is left open, the high output-drive capacity of the inverter causes this external lead to radiate an alternating electromagnetic field with sharp transitions between the high and low states. These sharp transitions can easily generate electromagnetic interference (EMI) in other circuits nearby.

If a complementary external clock signal is supplied to this external lead from an external inverter, differences between the switching characteristics of the oscillator's inverter and the external inverter may create momentary short-circuit conditions, in which the output of one inverter is high while the output of the other inverter is low. The high output-drive capacity of the oscillator's inverter can generate considerable current flow through the external lead during these moments, again creating electromagnetic interference, not to mention unwanted dissipation of current and power.

Current and power are also dissipated unnecessarily in the feedback resistor during the second mode of operation, regardless of how the external leads are connected.

SUMMARY OF THE INVENTION

It is accordingly an object of the present invention to reduce electromagnetic interference when an oscillator circuit is driven by an external clock signal.

Another object of the invention is to reduce current and power dissipation when an oscillator circuit is driven by an external clock signal.

According to a first aspect of the invention, an oscillator circuit comprises an inverter with input and output terminals, a first switching circuit for switchably reducing the output-drive capacity of the inverter, and a second switching circuit for switchably coupling the input and output terminals of the inverter together through a certain resistance. In a first mode of operation, the first switching circuit is switched so as not to reduce the output-drive capacity of the inverter, the second switching circuit is switched so as to couple the input and output terminals of the inverter together through the above-mentioned resistance, and an external resonator is coupled to the input and output terminals. In a second mode of operation, the first switching circuit is switched so as to reduce the output-drive capacity of the inverter, the second switching circuit is switched so as not to couple the input and output terminals of the inverter together, and an external clock signal is supplied to the input terminal.

According to a second aspect of the invention, an oscillator circuit comprises an inverter with input and output terminals, the second switching circuit described above, and a third switching circuit for switclhably holding the output terminal of the inverter at a fixed potential. The output of the oscillator circuit is generated from the input terminal of the inverter. The third switching circuit is switched so as to hold the output terminal of the inverter at a fixed potential in the second mode of operation, in which an external clock signal is supplied to the input terminal, and riot to hold the output terminal of the inverter at a fixed potential in the first mode of operation, in which an external resonator is coupled to the input and output terminals.

In the second mode of operation, electromagnetic interference is reduced by reducing the output-drive capacity of the inverter in the first aspect of the invention, and by holding the output of the inverter at a fixed potential in the second aspect of the invention. In both aspects, current and power dissipation are reduced in the second mode of operation by switching off the resistive coupling between the input and output terminals.

DETAILED DESCRIPTION OF THE INVENTION

Embodiments of the invention will be described with reference to the attached illustrative drawings, following a more detailed description of the conventional oscillator circuit.

Figure 1:
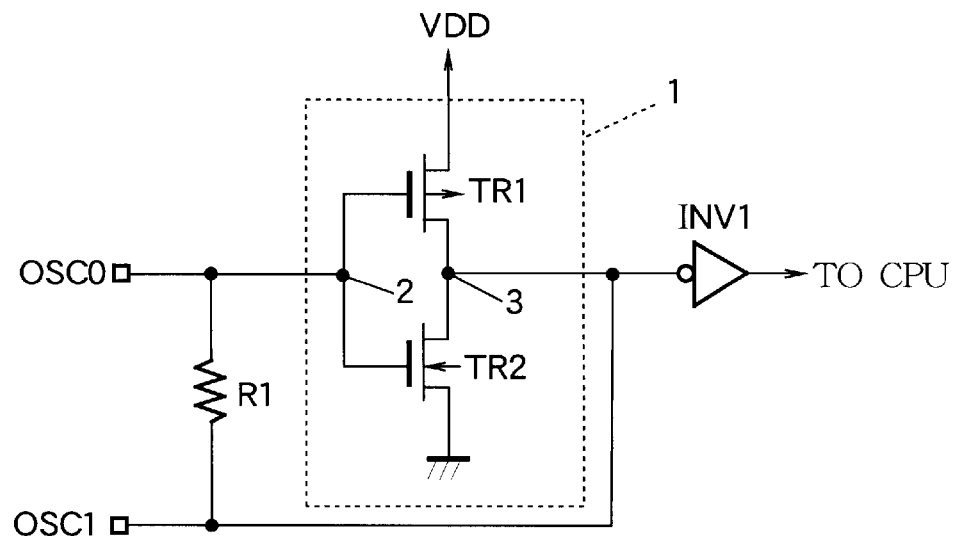
FIG. 1 is a schematic drawing of a conventional oscillator circuit.

FIG. 1 is a schematic diagram of the conventional oscillator circuit, shown for comparison with the present invention. The above-mentioned inverter 1 comprises a p-channel enhancement-mode metal-oxide-semiconductor field-effect transistor (referred to below as a PMOS transistor) TR1 and an n-channel enhancement-mode metal-oxide semiconductor field-effect transistor (referred to below as an NMOS transistor) TR2. Transistors TR1 and TR2 are coupled in series between a pair of power-supply potentials, represented in the drawing by the letters VDD and the ground symbol, VDD being positive with respect to ground. The input terminal 2 of inverter 1 is coupled to the gate terminals of transistors TR1 and TR2, to one end of a feedback resistance R1, and to an external lead OSCO; the output terminal 3 of inverter 1 is coupled to the drain terminals of transistors TR1 and TR2, to the other end of feedback resistance R1, to another external lead OSC1, and to the input terminal of a second inverter INV1. The output of inverter INV1 is a clock signal supplied to, for example, the central processing unit (CPU, not visible) of a microcontroller in which the oscillator circuit is employed.

To say that inverter 1 has a high output-drive capacity means, basically, that transistors TR1 and TR2 have wide channels and low on-resistances, and can therefore allow relatively large currents to flow from VDD to external lead OSC1, or from OSC1 to ground.

Figure 2:
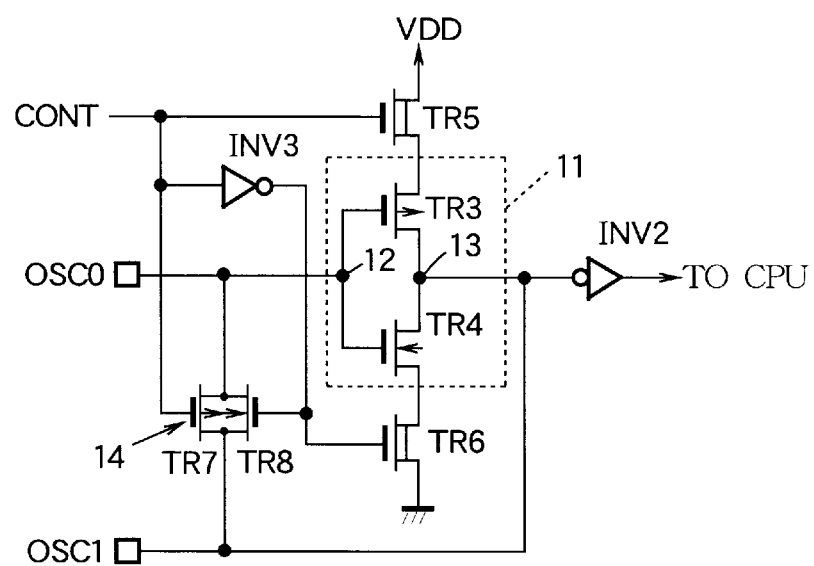
FIG. 2 is a schematic drawing of a first embodiment of the invention.

FIG. 2 is a schematic diagram of a first embodiment, illustrating the first aspect of the invention. Inverter 11 is similar to inverter 1 in the prior art, comprising a PMOS transistor TR3 and an NMOS transistor TR4 coupled in series between VDD and ground. The input terminal 12 and output terminal 13 of inverter 11 are coupled to external leads OSCO and OSC1, respectively. The output terminal 13 is also coupled to a second inverter INV2, similar to inverter INV1 in FIG. 1.

The output-drive capacity of inverter 11 is controlled by a first switching circuit comprising a p-channel, depletion-mode metal-oxide-semiconductor field-effect transistor TR5 and an n-channel depletion-mode metal oxide-semiconductor field-effect transistor TR6. Both transistors TR5 and TR6 are of the normally-on type. When the gate potential of transistor TRS is VDD, transistor TR5 conducts, but with a comparatively high resistance. When the gate potential of transistor TR5 is the ground potential, transistor TR5 conducts with a comparatively low resistance. Transistor TR6 conducts with a comparatively high resistance when its gate potential is the ground potential, and with a comparatively low resistance when its gate potential is VDD.

The input terminal 12 and output terminal 13 of inverter 11 are coupled together through a second switching circuit comprising a PMOS transistor TR7 and an NMOS transistor TR8. These two transistors TR7 and TR8 are coupled in parallel, forming a transmission gate 14, and are designed to have a comparatively high on-resistance. When the gate potential of transistor TR7 is the ground potential and the gate potential of transistor TR8 is VDD, both transistors conduct, acting as a feedback resistance equivalent to R1 in FIG. 1. That is, the combined parallel on-resistance of transistors TR7 and TR8 is substantially equal to resistance R1. When the gate potential of transistor TR7 is VDD and the gate potential of transistor TR8 is the ground potential, both transistors are switched off.

The first and second switching circuits are controlled by a control signal (CONT), which is applied to the gate terminals of transistors TR5 and TR7. This control signal is also inverted by an inverter INV3, and the inverted control signal is applied to the gate terminals of transistors TR6 and TR8. When the first embodiment is employed in a microcontroller, the control signal (CONT) is generated by having the microcontroller's software set or clear a flag bit.

The first embodiment operates in a first mode and second mode as follows.

In the first mode, an external crystal resonator (not visible) is coupled to leads OSC0 and OSC1, and the above-mentioned flag bit is cleared so that CONT is low, the transmission gate 14 is switched on, and transistors TR5 and TR6 conduct with low resistance. In this mode, the first embodiment operates in substantially the same way as the conventional oscillator circuit in FIG. 1. This mode is employed in, for example, a microcontroller operating as a master controller.

In the second mode of operation, an external clock signal is supplied to external lead OSCO. External lead OSC1 may be left open, or a complementary clock signal may be supplied. The above-mentioned flag bit is set so that CONT is high, the transmission gate 14 is switched off, and transistors TR5 and TR6 conduct with comparatively high resistance. This high resistance reduces the output-drive capacity of inverter 11 by limiting the current flow through inverter 11. This mode is employed in, for example, a microcontroller operating as a slave controller.

In the second mode of operation, if external lead OSC1 is left open, the reduced output-drive capacity of inverter 11 reduces the rate at which the capacitance of lead OSC1 and its internal wiring is charged and discharged, so that abrupt high-low transitions do not occur. Electromagnetic interference is therefore reduced. Current and power dissipation is also reduced, as compared with the conventional oscillator circuit, because no current flows through the transmission gate 14.

If a complementary external clock signal is supplied to lead OSC1, the reduced output-drive capacity of inverter 11 limits the current flow through this lead, even if momentary short-circuit conditions occur between inverter 11 and the external inverter (not visible) that generates the complementary clock signal. Electromagnetic interference and current and power dissipation are therefore reduced. Current and power dissipation is also reduced because the transmission gate 14 is switched off.

Figure 3:
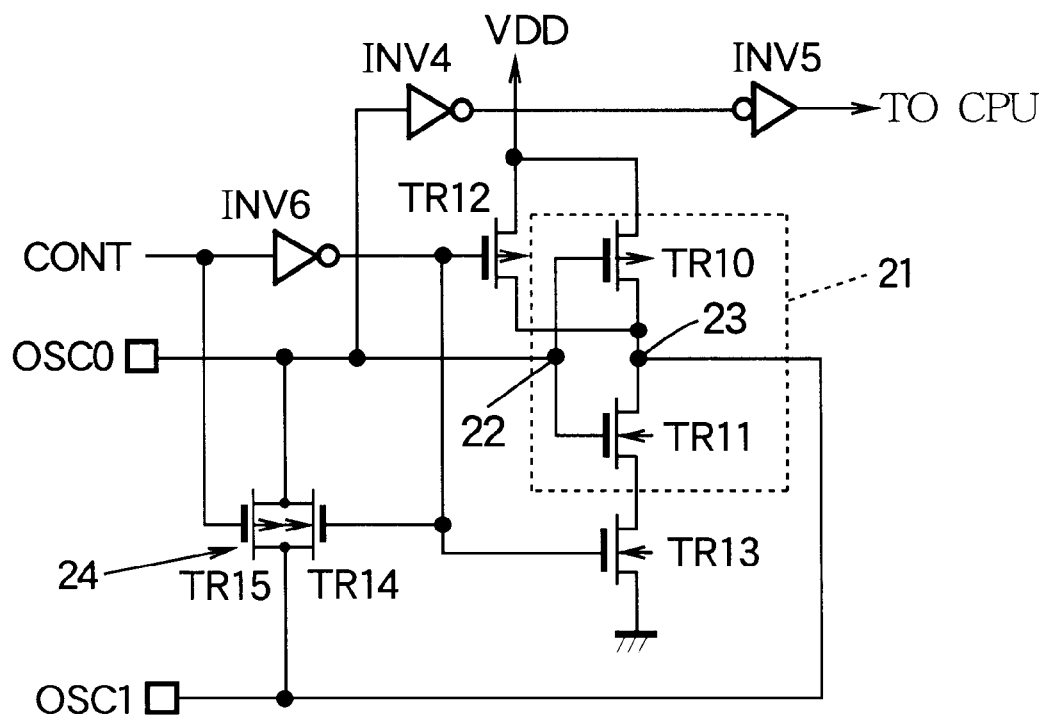
FIG. 3 is a schematic drawing of a second embodiment of the invention.

FIG. 3 is a schematic diagram of a second embodiment, illustrating the second aspect of the invention. Inverter 21 is similar to inverter 11 in the first embodiment, comprising a PMOS transistor TR10 and an NMOS transistor TR11 coupled in series between VDD and ground, their gate terminals being coupled to external lead OSC0, and their drain terminals to external lead OSC1. The output of the second embodiment is generated from the signal at the input terminal 22 or inverter 21 by a further pair of inverters INV4 and INV5.

The second embodiment has a third switching circuit comprising a PMOS transistor TR12 and an NMOS transistor TR13. Transistor TR12 is coupled in parallel with transistor TR10, between VDD and the output terminal 23 of inverter 21. Transistor TR13 is coupled in series with transistor TR11, between the output terminal 23 of inverter 21 and ground.

The second switching circuit or transmission gate 24, comprising an NMOS transistor TR14 and a PMOS transistor TR15, is similar to the transmission gate 14 in the first embodiment.

The second and third switching circuits are controlled by a control signal (CONT), which is supplied to the gate of transistor TR15 and to an inverter INV6. The inverted control signal output by inverter INV6 is supplied to the gates of transistors TR12, TR13, and TR14.

In the first mode of operation, when an external crystal resonator is coupled to leads OSC0 and OSC1, the control signal CONT is low, transistor TR12 is switched off, transistor TR13 is switched on, and the transmission gate 24 is switched on. In this mode, the first embodiment operates in substantially the same way as the conventional oscillator circuit in FIG. 1. In particular, the phase of the output signal of the second embodiment (the output of inverter INV5) is the same as the phase of the output in FIG. 1 (the output of inverter INV1), even though the output signal is generated from the input terminal 22 of inverter 21 instead of from the output terminal 23.

In the second mode of operation, an external clock signal is supplied to external lead OSCO, and external lead OSC1 is left open. The control signal CONT is high, transistor TR12 is switched on, transistor TR13 is switched off, and the transmission gate 24 is switched off. The output of inverter 21 is held at the high level, being coupled through transistor TR12 to VDD, and disconnected from ground by transistor TR13. The output signal of the second embodiment is created by inverting the external clock signal twice, in inverters INV4 and INV5. The output signal has the same phase as in the first embodiment and conventional art.

In the second mode, no electromagnetic interference is generated at external lead OSC1, because this lead is held at a constant potential. No current or power is dissipated in the transmission gate 24, which is switched off. A further advantage is that there is never any need for input of a complementary clock signal at OSC1.

The embodiments described above can be varied in numerous ways. For example, the control signal (CONT) can generated by input at another external lead, instead of being generated by a flag bit. The polarity of the control signal can be reversed. The output signal of the first embodiment may be generated from the input terminal 12 of inverter it, as in the second embodiment. The first switching circuit in the first embodiment need not comprise depletion-mode transistors; another possible scheme replaces transistors TR3 and TR4 by respective pairs of parallel transistors, and uses further enhancement-mode transistors to cut off the power supply to one transistor in each pair in the second mode. The second switching circuit in either embodiment may comprise a transistor and resistor coupled in series, instead of a transmission gate. In the second embodiment, in the second mode of operation, the output terminal 23 of inverter 21 can be held Low instead of high, by coupling transistor TR12 in series with transistor TR10, coupling transistor TR13 in parallel with transistor TR11, and supplying the nor-inverted control signal to the gates of transistors TR12 and TR13.

Those skilled in the art will recognize that further variations are possible within the scope claimed below.

What is claimed:

1. An oscillator circuit comprising an inverter having an input terminal and an output terminal, said oscillator circuit operative in a first mode in which an external resonator is coupled to said input terminal and said output terminal of said inverter, and in a second mode in which an external clock signal is supplied to said input terminal of said inverter, said oscillator circuit further comprising:

a first switching circuit, coupled to said inverter, for reducing an output-drive capacity of said inverter in said second mode relative to an output-drive capacity of said inverter in said first mode; and a second switching circuit, coupled to said inverter, for coupling said input terminal of said invertor to said output terminal of said inverter via a first resistance in said first mode, and for decoupling said input terminal of said inverter and said output terminal of said inverter in said second mode.

2. The oscillator circuit of claim 1, wherein said first switching circuit comprises at least one depletion-mode field-effect transistor which is switched so as to have a higher on-resistance in said second mode than in said first mode.

3. The oscillator circuit of claim 2, wherein said at least one depletion-mode field-effect transistor comprises a p-channel depletion-mode field-effect transistor and an n-channel depletion-mode field-effect transistor;

wherein said inverter comprises a p-channel enhancement-mode field-effect transistor and a n-channel enhancement-mode field-effect transistor coupled in series between a pair of power-supply potentials; and wherein said p-channel depletion-mode field-effect transistor is coupled in series with said p-channel enhancement-mode field-effect transistor, and said n-channel depletion-mode field-effect transistor is coupled in series with said n-channel enhancement-mode field-effect transistor.

4. The oscillator circuit of claim 1, wherein said second switching circuit comprises a p-channel enhancement-mode field-effect transistor and an n-channel enhancement-mode field-effect transistor coupled in parallel between said input terminal and said output terminal of said inverter, said p-channel enhancement-mode field-effect transistor and said n-channel enhancement-mode field-effect transistor having a combined on-resistance equal to said first resistance and being switched on in said first mode and off in said second mode.

5. An oscillator circuit comprising an inverter having an input terminal and an output terminal, said oscillator circuit operative in a first mode in which an external resonator is coupled to said input terminal and said output terminal of said inverter, and in a second mode in which an external clock signal is supplied to said input terminal of said invertor, said oscillator circuit further comprising:

a first switching circuit, coupled to said inverter, for holding said output terminal at a fixed potential in said second mode, and for removing said fixed potential from said output terminal in said first mode; and a second switching circuit, coupled to said inverter, for coupling said input terminal of said inverter to said output terminal of said inverter via a first resistance in said first mode, and for decoupling said input terminal of said inverter and said output terminal of said inverter in said second mode;

wherein an output signal of said oscillator circuit is generated from said input terminal of said inverter.

6. The oscillator circuit of claim 5, wherein said inverter comprises a first field-effect transistor and a second field-effect transistor of opposite channel types coupled in series between a pair of power-supply potentials; and wherein said first switching circuit comprises a third field-effect transistor coupled in parallel with said first field-effect transistor, and a fourth field-effect transistor coupled in series with said second field-effect transistor, said third field-effect transistor being switched off in said first mode and on in said second mode, and said fourth field-effect transistor being switched on in said first mode and off in said second mode.

7. The oscillator circuit of claim 5, wherein said second switching circuit comprises a first field-effect transistor and a second field-effect transistor of opposite channel types coupled in parallel between said input terminal and said output terminal, said first field-effect transistor and said second field-effect transistor having a combined on-resistance equal to said first resistance and being switched on in said first mode and off in said second mode.

8. The oscillator circuit of claim 5, further comprising an additional pair of inverters coupled in series to said input terminal, for generating said output signal from said input terminal.

* * * * *